(12) United States Patent
Lin et al.

(10) Patent No.: US 9,289,846 B2
(45) Date of Patent: Mar. 22, 2016

(54) METHOD FOR FABRICATING WIRE BONDING STRUCTURE

(71) Applicant: Siliconware Precision Industries Co., Ltd, Taichung (TW)

(72) Inventors: Wei-Sheng Lin, Taichung (TW); Lung-Tang Hung, Taichung (TW); Meng-Hung Yeh, Taichung (TW); Zhi-Lun Hsieh, Taichung (TW); Yude Chu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 54 days.

(21) Appl. No.: 14/085,981

(22) Filed: Nov. 21, 2013

(65) Prior Publication Data

US 2015/0028081 A1    Jan. 29, 2015

(30) Foreign Application Priority Data

Jul. 23, 2013   (TW) .............................. 102126231 A

(51) Int. Cl.
*B23K 31/02* (2006.01)
*B23K 20/00* (2006.01)
*H01L 23/00* (2006.01)

(52) U.S. Cl.
CPC .............. *B23K 20/007* (2013.01); *H01L 24/85* (2013.01); *H01L 24/45* (2013.01); *H01L 24/48* (2013.01); *H01L 2224/45139* (2013.01); *H01L 2224/45144* (2013.01); *H01L 2224/45147* (2013.01); *H01L 2224/4848* (2013.01); *H01L 2224/48227* (2013.01); *H01L 2224/48247* (2013.01); *H01L 2224/48463* (2013.01); *H01L 2224/85012* (2013.01); *H01L 2224/8517* (2013.01); *H01L 2224/85051* (2013.01); *H01L 2224/85205* (2013.01); *H01L 2224/85206* (2013.01); *H01L 2924/00014* (2013.01)

(58) Field of Classification Search
None
See application file for complete search history.

(56) References Cited

U.S. PATENT DOCUMENTS

| | | | | |
|---|---|---|---|---|
| 4,415,115 A | * | 11/1983 | James | 228/170 |
| 5,119,436 A | * | 6/1992 | Holdgrafer | 382/146 |
| 5,172,851 A | * | 12/1992 | Matsushita et al. | 228/180.22 |
| 5,346,748 A | * | 9/1994 | Yokono | 428/209 |
| 6,080,651 A | * | 6/2000 | Takahashi et al. | 438/617 |
| 6,622,903 B1 | * | 9/2003 | Greenwell | 228/110.1 |
| 7,071,090 B2 | * | 7/2006 | Higashi et al. | 438/617 |
| 7,083,077 B2 | * | 8/2006 | Wildner | 228/4.5 |
| 7,371,676 B2 | * | 5/2008 | Hembree | 438/617 |
| 7,658,314 B2 | * | 2/2010 | Tei et al. | 228/180.5 |
| 7,975,901 B2 | * | 7/2011 | Maeda et al. | 228/180.5 |
| 2001/0042781 A1 | * | 11/2001 | Vitali et al. | 228/258 |
| 2003/0155660 A1 | * | 8/2003 | Takahashi et al. | 257/777 |
| 2005/0173491 A1 | * | 8/2005 | Kim et al. | 228/4.5 |

(Continued)

FOREIGN PATENT DOCUMENTS

EP           478116 A1 *   4/1992  ............. H01L 21/00

*Primary Examiner* — Kiley Stoner
(74) *Attorney, Agent, or Firm* — Mintz Levin Cohn Ferris Glovsky and Popeo, P.C.; Peter F. Corless; Steven M. Jensen

(57) ABSTRACT

A method for fabricating a wire bonding structure is disclosed, which includes: providing a substrate having a plurality of bonding pads; and foaming a ball end of a bonding wire on at least one of the bonding pads by performing a scrubbing process along a path around a periphery of the bonding pad, thereby preventing delamination of the ball end of small size from the bonding pad.

7 Claims, 4 Drawing Sheets

(56) References Cited

U.S. PATENT DOCUMENTS

| | | | |
|---|---|---|---|
| 2006/0054665 A1* | 3/2006 | Calpito et al. | 228/180.5 |
| 2007/0230771 A1* | 10/2007 | Chung et al. | 382/151 |
| 2008/0197510 A1* | 8/2008 | Mii et al. | 257/780 |
| 2010/0230809 A1* | 9/2010 | Calpito et al. | 257/737 |
| 2011/0315743 A1* | 12/2011 | Maruya et al. | 228/102 |
| 2014/0054781 A1* | 2/2014 | Higgins et al. | 257/762 |

* cited by examiner

METHOD FOR FABRICATING WIRE BONDING STRUCTURE

CROSS-REFERENCES TO RELATED APPLICATIONS

This application claims under 35 U.S.C. §119(a) the benefit of Taiwanese Application No. 10216231, filed Jul. 23, 2013, the entire contents of which is incorporated herein by reference.

BACKGROUND OF THE INVENTION

1. Field of the Invention

The present invention relates to semiconductor processes, and more particularly, to a method for fabricating a wire bonding structure.

2. Description of Related Art

Current semiconductor packaging technologies generally involve performing wire bonding processes to form gold or copper bonding wires for electrically connecting semiconductor chips and carriers such as lead frames or packaging substrates. Further, the carriers are electrically connected to external devices such as circuit boards through conductive elements, for example, solder balls.

To perform such a wire bonding process, a ball end of a bonding wire is formed by the tip of a capillary through ultrasonic vibration on a bonding pad of a semiconductor device or a carrier and then bonded to the bonding pad by pressure. Thereafter, a wire body of the bonding wire is extended from the ball end and bonded by pressure to a bonding pad of another semiconductor device or carrier. Thereafter, the bonding wire is cut by the tip of the capillary.

FIG. 1A is a schematic cross-sectional view of a conventional wire bonding structure 1. Referring to FIG. 1A, a ball end 12a of a bonding wire 12 is formed by an ultrasonic vibration device through a scrubbing process on a bonding pad 11 of a substrate 10. Then, the ball end 12a is bonded to the bonding pad 11 by pressure. Thereafter, the wire body of the bonding wire 12 is extended from the ball end 12a.

During the scrubbing process for forming the ball end 12a, particles and organic thin films generated during fabrication of the substrate 10 can be removed. Further, the scrubbing process is performed by the ultrasonic vibration device along a path in a vertical direction (Y direction) or a horizontal direction (X direction) to form a solder material on the bonding pad 11, thereby forming the ball end 12a, as shown in FIG. 1B.

The above-described scrubbing process is suitable for forming a ball end on the bonding pad 11 of large size, for example, on the bonding pad 11 having a width d greater than 40 um.

However, as circuits are developed toward fine pitches, the width d of the bonding pad 11 is continuously reduced. Accordingly, the size of the ball end 12a needs to be reduced. When the width d of the bonding pad 11 is reduced below 40 um, if the ball end 12a is formed through the above-described scrubbing process, delamination easily occurs between the ball end 12a and the bonding pad 11.

Further, the bonding wire 12 is generally made of a hard material such as copper or gold. When such a bonding wire is bonded to a very thin substrate such as a semiconductor chip, the bonding pad is easily damaged by the above-described scrubbing process for forming the ball end 12a.

Therefore, there is a need to provide a method for fabricating a wire bonding structure so as to overcome the above-described drawbacks.

SUMMARY OF THE INVENTION

In view of the above-described drawbacks, the present invention provides a method for fabricating a wire bonding structure, which comprises the steps of providing a substrate having a plurality of bonding pads; and forming a ball end of a bonding wire on at least one of the bonding pads by performing a scrubbing process along a path around a periphery of the bonding pad.

In the above-described method, the bonding pad can have a width less than 40 um.

In the above-described method, the path of the scrubbing process around the periphery of the bonding pad can be clockwise or counterclockwise.

In the above-described method, the path of the scrubbing process can be from a center of the bonding pad to the periphery of the bonding pad and then around the periphery of the bonding pad.

In the above-described method, the bonding wire can be made of made of copper, silver or gold.

After the ball end is formed, the above-described method can further comprise pressing the ball end on the bonding pad.

After the ball end is formed, the above-described method can further comprise forming a wire body of the bonding wire that extends from the ball end.

Therefore, the present invention performs a scrubbing process along a path around a periphery of a bonding pad so as to form a ball end of a bonding wire on the bonding pad, which not only effectively removes particles and organic thin films generated during the fabrication process, but also strengthens the bonding between the ball end and the bonding pad to thereby prevent delamination of the ball end from the bonding pad.

Further, by performing the scrubbing process of the present invention, a hard wire material can be bonded to a very thin substrate without causing damage of the bonding pad.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

Figure 1A:
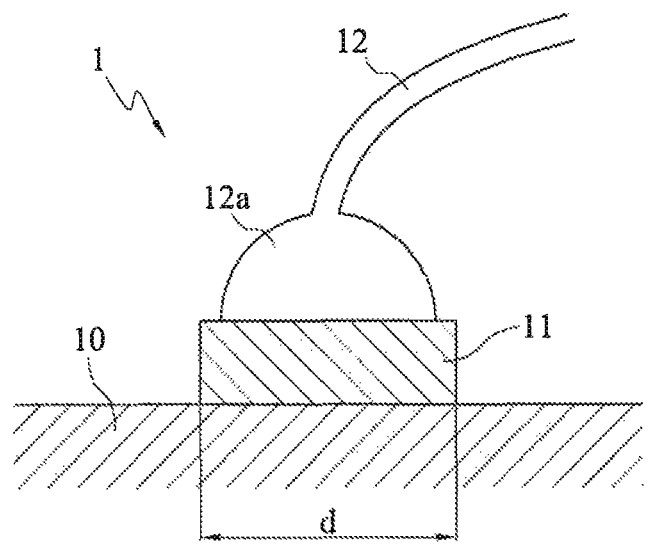
FIG. 1A is a schematic cross-sectional view of a conventional wire bonding structure.
Figure 1B:
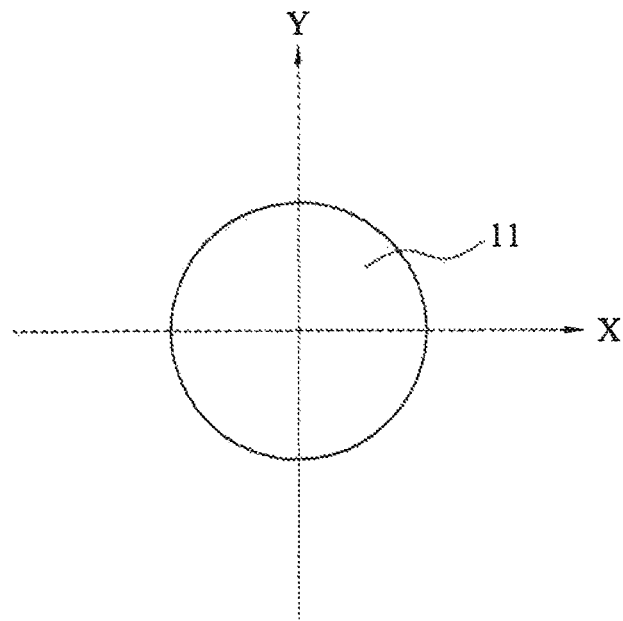
FIG. 1B is a planar top view of the scrubbing path of a conventional scrubbing process.
Figure 2A:
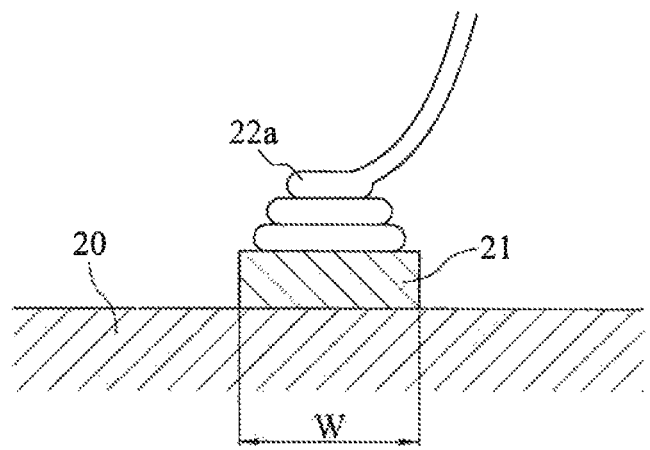
FIGS. 2A and 2B are schematic cross-sectional views showing a method for fabricating a wire bonding structure according to the present invention.
Figure 2B:
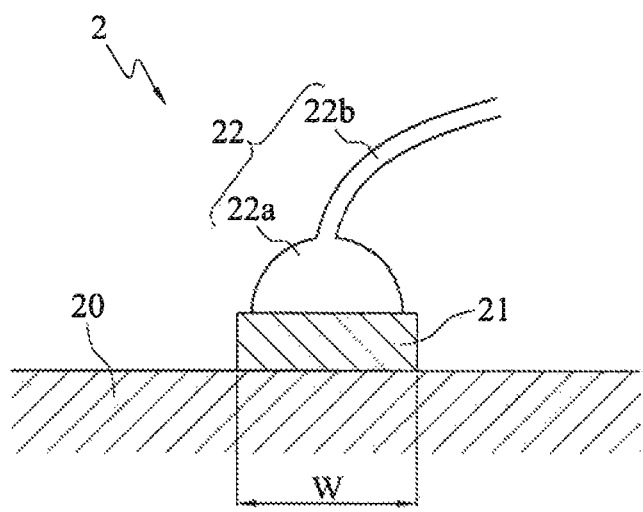

FIGS. 2A and 2B are schematic cross-sectional views showing a method for fabricating a wire bonding structure 2 according to the present invention.

Figure 3A:
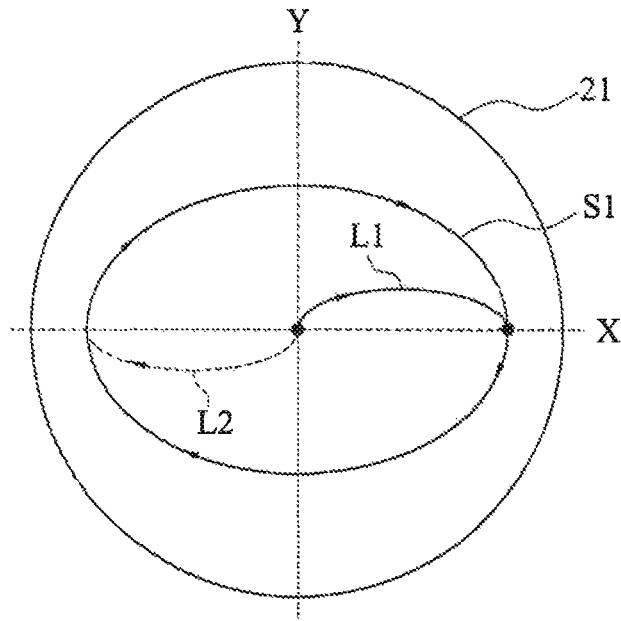
FIGS. 3A to 3B' are planar top views of the scrubbing path of a scrubbing process according to different embodiments of the present invention.
Figure 3A:
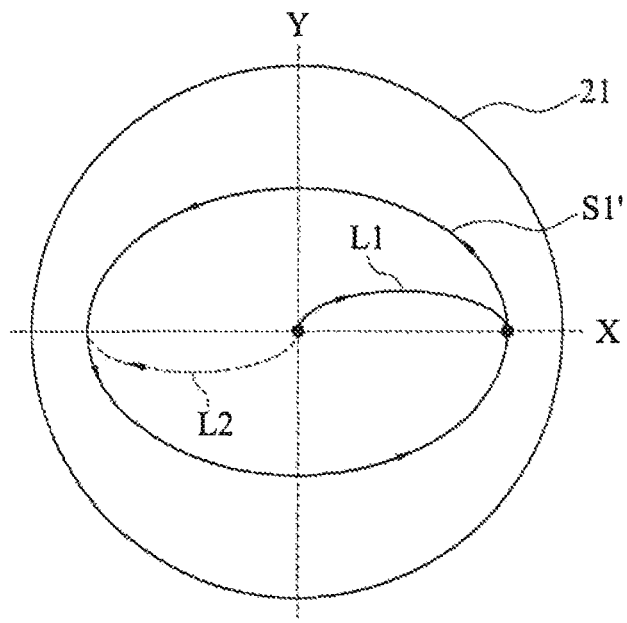

Referring to FIGS. 2A and 3A, a substrate 20 having at least a bonding pad 21 is provided. A scrubbing process is performed by an ultrasonic vibration device (not shown) along a path S1 of FIG. 3A around a periphery of the bonding pad 21 so as to form a ball end 22a on the bonding pad 21.

Referring to FIG. 2B, the ball end 22a is pressed on the bonding pad 21 and a wire body 22b is extended from the ball end 22a to form a bonding wire 22. The bonding wire 22 is comprised of the ball end 22a and the wire body 22b.

In the present embodiment, the substrate 20 can be a packaging substrate or a lead frame. The bonding pad can be an electrical contact pad or a lead. The bonding wire 22 can be made of copper, silver or gold.

The bonding pad 21 can have a width less than 40 um.

Referring to FIG. 3A, the scrubbing process is performed first along an upper camber line path L1 from the center of the bonding pad 21 to a right side of the periphery of the bonding pad 21 and then along the path S1 around the periphery of the bonding pad 21 in a clockwise direction or along a path S1' of FIG. 3A' in a counterclockwise direction so as to form the ball end 22a. In another embodiment, the scrubbing process can be performed first along a lower camber line path L2 from the center of the bonding pad 24 to a left side of the periphery of the bonding pad 21.

Further, position setting of the ultrasonic vibration device is described as follows. Since the ultrasonic vibration device has an original output direction of Y direction, the output direction of the ultrasonic vibration process in the scrubbing process can be compensated in a horizontal direction, i.e, X direction, such that the bottom surface of the ball end 22a (i.e, the surface in contact with the bonding pad 21) after the scrubbing process is close to a circular shape.

Figure 3B:
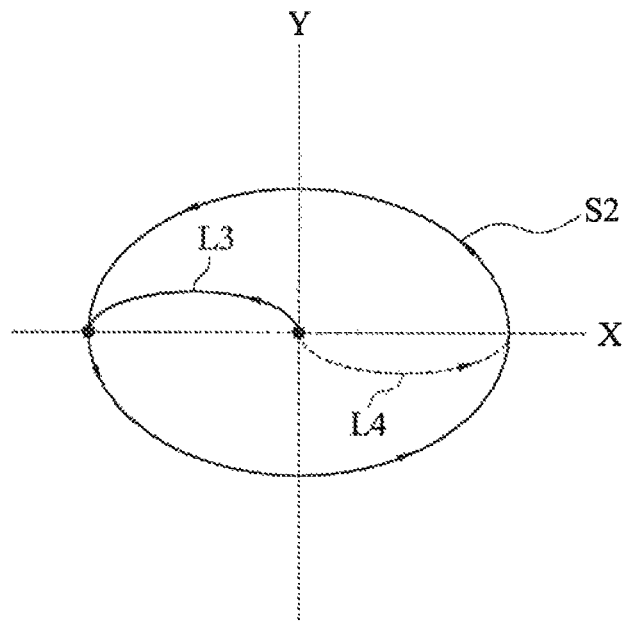
Figure 3B:
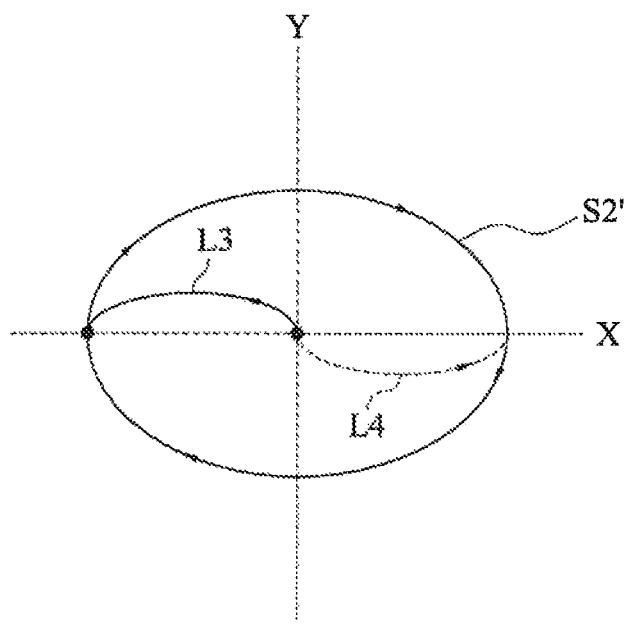

In another embodiment, referring to FIG. 3B, the scrubbing process can be performed first along an upper camber line path L3 from the center of the bonding pad 21 to the left side of the periphery of the bonding pad 21 and then along the path S2 around the periphery of the bonding pad 21 in a counterclockwise direction or along the path S2' of FIG. 3B' in a clockwise direction so as to form the ball end 22a. In a further embodiment, the scrubbing process can be performed first along a lower camber line path L4 from the center of the bonding pad 21 to the right side of the periphery of the bonding pad 21.

Therefore, there are various combinations of the camber line paths L1, L2, L3, L4 and the circular paths S1, S2. But it should be noted that the present invention is not limited thereto.

Therefore, even if a bonding pad 21 has a width less than 40 um, the present invention can effectively form a ball end 22a of a bonding wire 22 on the bonding pad 21 by performing a scrubbing process along a path around a periphery of the bonding pad 21, thereby preventing delamination of the ball end 22a from the bonding pad 21.

Further, by performing the scrubbing process of the present invention, stresses applied by the wire material on the bonding pad 21 can be dispersed. As such, a hard wire material can be bonded to a very thin substrate without causing damage of the bonding pad 21.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a wire bonding structure, comprising the steps of:
   providing a substrate having a plurality of bonding pads; and
   forming a ball end of a bonding wire on at least one of the bonding pads by performing a scrubbing process along a camber line path from a center of each of the bonding pads to a point on a periphery of each of the bonding pads, and then following a path around the periphery of each of the bonding pads to the point where the camber line path intersected the periphery.

2. The method of claim 1, wherein the bonding pad has a width less than 40 um.

3. The method of claim 1, wherein the path of the scrubbing process around the periphery of the bonding pad is clockwise.

4. The method of claim 1, wherein the path of the scrubbing process around the periphery of the bonding pad is counterclockwise.

5. The method of claim 1, wherein the bonding wire is made of copper, silver or gold.

6. The method of claim 1, after forming the ball end, further comprising pressing the ball end on the bonding pad.

7. The method of claim 1, after forming the ball end, further comprising forming a wire body of the bonding wire that extends from the ball end.

\* \* \* \* \*